(12) United States Patent
Chuang et al.

(10) Patent No.: US 7,892,869 B2
(45) Date of Patent: Feb. 22, 2011

(54) METHOD FOR MANUFACTURING LIGHT EMITTING DIODE ASSEMBLY

(75) Inventors: Shih-Tai Chuang, Taipei (TW); Hsi-Ku Tu, Taichung (TW)

(73) Assignee: Edison Opto Corporation, Taipei Hsien (TW)

( * ) Notice: Subject to any disclaimer, the term of this patent is extended or adjusted under 35 U.S.C. 154(b) by 33 days.

(21) Appl. No.: 12/507,987

(22) Filed: Jul. 23, 2009

(65) Prior Publication Data

US 2011/0020961 A1      Jan. 27, 2011

(51) Int. Cl.
*H01L 21/00* (2006.01)

(52) U.S. Cl. .............................. 438/26; 438/66; 257/98; 257/E33.057

(58) Field of Classification Search .................... 438/24, 438/26–28, 64–67; 257/98, 99, E33.056, 257/E33.057
See application file for complete search history.

(56) References Cited

U.S. PATENT DOCUMENTS

| | | | | |
|---|---|---|---|---|
| 6,184,544 B1 * | 2/2001 | Toda et al. | .................... | 257/98 |
| 6,956,245 B2 * | 10/2005 | Senda et al. | ................... | 257/94 |
| 7,256,428 B2 * | 8/2007 | Braune et al. | ................ | 257/100 |
| 7,812,358 B2 * | 10/2010 | Yasuda | ........................ | 257/97 |
| 2003/0153108 A1 * | 8/2003 | Durocher et al. | .............. | 438/26 |

\* cited by examiner

*Primary Examiner*—Tuan N. Quach
(74) *Attorney, Agent, or Firm*—Rosenberg, Klein & Lee (57) ABSTRACT

A method for manufacturing a light emitting diode (LED) assembly comprises the steps of: preparing a chip carrier comprising a carrier substrate, a P type electrode and an N type electrode, and arranging an LED chip onto the carrier substrate to electrically connect the LED chip with the P type electrode and the N type electrode; packaging the LED chip with a light-transmissible packaging gel and making the P type electrode and the N type electrode exposed to form a molded LED chip cell; preparing an arrangement carrier comprising a arrangement carrier substrate, a P type electrode plate and an N type electrode plate; forming an arrangement recess on the arrangement carrier substrate; and arranging the molded LED chip cell into the arrangement recess to make the P type electrode and the N type electrode electrically connect to the P type electrode plate and the N type electrode plate respectively.

13 Claims, 8 Drawing Sheets

METHOD FOR MANUFACTURING LIGHT EMITTING DIODE ASSEMBLY

FIELD OF THE INVENTION

The present invention relates to a method for manufacturing a light emitting diode (LED) assembly, and more particularly to a method for manufacturing a molded LED chip cell, and further assembling the molded LED chip cell to an arrangement carrier to manufacture the LED assembly.

BACKGROUND OF THE INVENTION

In daily life, for identifying objects and directions in dark environment, it is usually necessary to provide illumination for us via the utilization of a light emitting assembly. Among the light emitting assemblies, LED has become the most popular light emitting assembly gradually due to global energy saving trend and its advantages of long usage life and low power consumption.

However, besides the usage of wide-field illumination, due to that the LED has the advantages of long usage life and low power consumption, LED is also usually applied to be assembled into the LED assembly to provide for the backlight of the electronic devices or for other utilization. Among numerous LED assemblies, for the purpose of satisfying more requests of illumination, and making the LED assembly electrically connected to the electrical contacts of the circuit board become more convenient, it is usually to form a recess in a carrier and make the a P type electrode plate and an N type electrode plate respectively be extended to a first side and a second side from the recess.

Figure 1A:
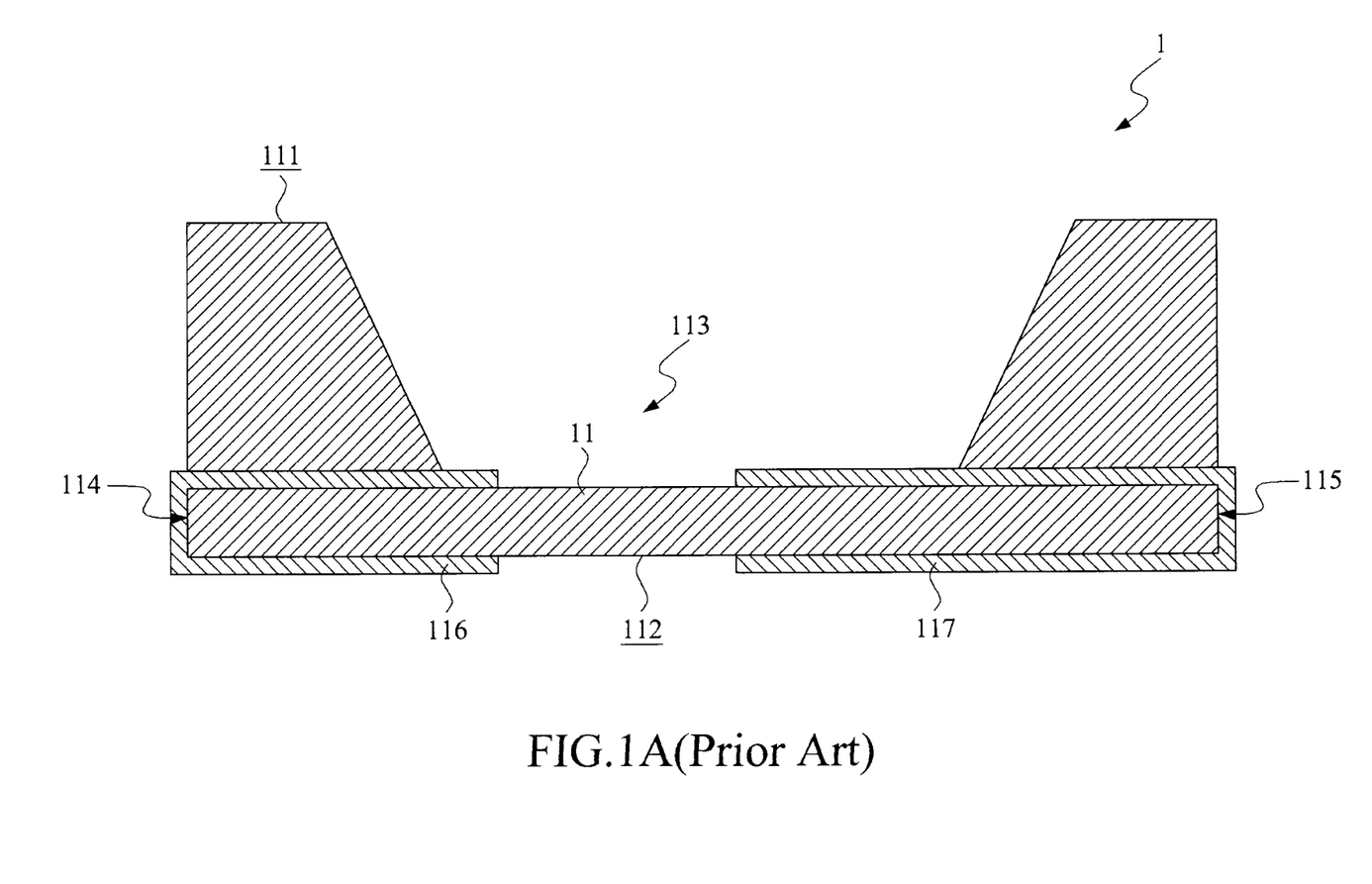
FIG. 1 to FIG. 1C illustrate a series of steps for manufacturing the conventional LED assembly in prior arts.
Figure 1B:
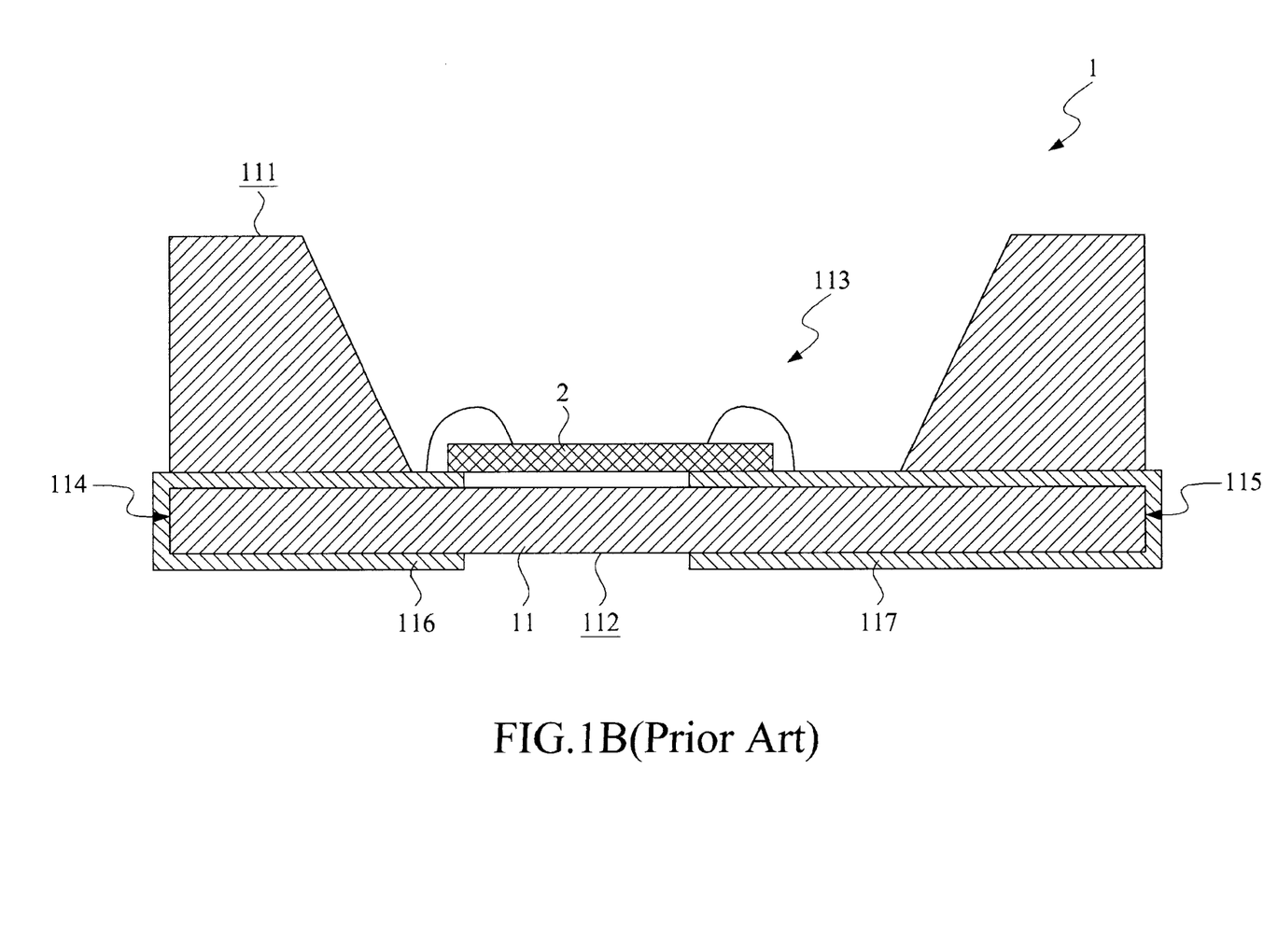
Figure 1C:
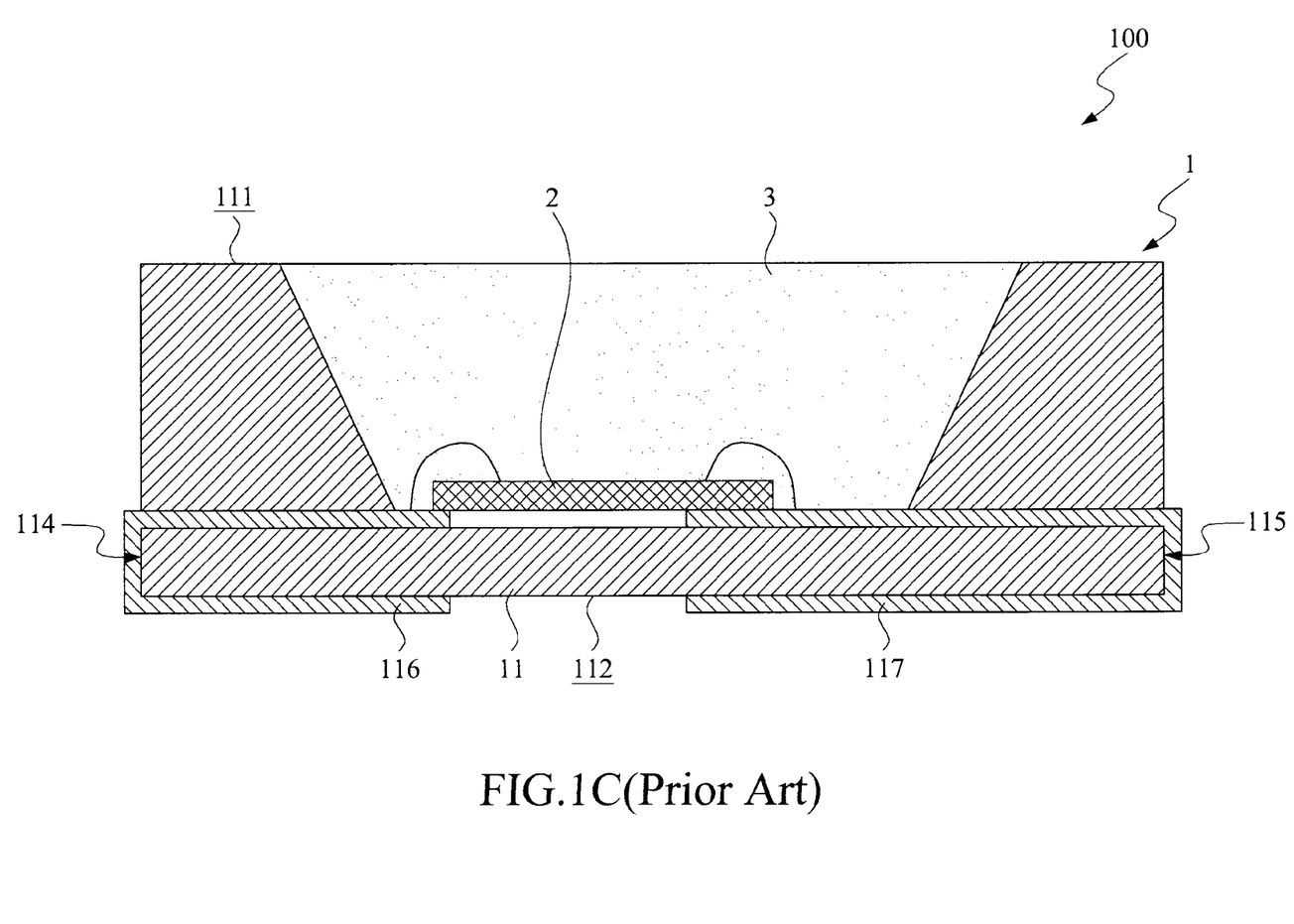

Based on the background as mentioned, following up, a representative technology for manufacturing the conventional LED assembly in prior art is disclosed for more detail illustration. Please refer to the drawings from FIG. 1A to FIG. 1C, which illustrate a series of steps for manufacturing the conventional LED assembly in prior arts. As shown in FIG. 1, when manufacturing a light emitting diode (LED) assembly 100, firstly, it is necessary to prepare a carrier 1, which includes a carrier substrate 11, a P type electrode plate 12 and an N type electrode plate 13.

The carrier substrate 11 has a light-emitting surface 111 and a back surface 112, and the light-emitting surface 111 is formed with a recess 113. Moreover, the carrier substrate 11 further has a first side 114 and a second side 115. The P type electrode plate 12 is extended from the bottom of the recess 113 to the first side 114, and further extended out to partially wrap the back surface 112. The N type electrode plate 13 is extended from the bottom of the recess 113 to the second side 114, and also extended out to partially wrap the back surface 112.

As shown in FIG. 1B, next, it is necessary to arrange an LED chip 2 to the bottom of the recess 113, and it is further necessary to make two lead wires connect the LED chip 2 to the P type electrode plate 12 and the N type electrode plate 13 respectively via a bonding process, so as to make the LED chip 2 be electrically connected with the P type electrode plate 12 and the N type electrode plate 13 respectively.

As shown in FIG. 1C, after making the LED chip 2 be electrically connected to the P type electrode plate 12 and the N type electrode plate 13 respectively, a light-transmissible gel 3 is filled into the recess 113 via a packaging process to package the LED chip 2 therein. After the light-transmissible gel is solidified, the manufacturing processes of the LED assembly 100 are finished.

People skilled in ordinary arts can easily find that in the prior art as disclosed above, before filling the light-transmissible gel 3 into the recess 113 via a packaging process, it is necessary to execute the bonding process to make the two lead wires connect the LED chip 2 to the P type electrode plate 12 and the N type electrode plate 13 respectively. Therefore, for the light beam (not shown in the drawings) projected from LED chip, its optical properties just can be modulated once via the light-transmissible gel 3, so that the design of the optical properties is seriously limited.

Additionally, when filling the light-transmissible gel 4 into the recess 113, it is necessary to apply a filling pressure to a die. Thus, the two lead wires might be pressed to make the electrical connection between the LED chip 2, the P type electrode plate 12 and the N type electrode plate 13 become worse. More seriously, due to that the light-transmissible gel 4 has been filled into recess 113 to package the LED chip 2 already, once the result of the examination of the electrical connection is failed, the whole LED assembly 100 has to be abandoned. In this case, it will spend more manufacturing cost.

SUMMARY OF THE INVENTION

Due to that the LED assembly of prior art exists the two problems, i.e., the design optical properties is seriously limited, and the whole LED assembly has to be abandoned to spend more manufacturing cost once the electrical examination is failed, the primary objective of the present invention is to manufacture a molded LED chip cell via a packaging process, and further to make the molded LED chip cell be electrically connected to an arrangement carrier.

Means of the present invention for solving the problems as mentioned above provides a method for manufacturing a LED assembly capable of bi-directional light emitting, the method comprises the steps of: preparing a chip carrier comprising a carrier substrate, a P type electrode and an N type electrode, and arranging an LED chip onto the carrier substrate to electrically connect the LED chip with the P type electrode and the N type electrode; packaging the LED chip with a light-transmissible packaging gel and making the P type electrode and the N type electrode exposed to form a molded LED chip cell; preparing an arrangement carrier comprising a arrangement carrier substrate, a P type electrode plate and an N type electrode plate; forming an arrangement recess on the arrangement carrier substrate; arranging the molded LED chip cell into the arrangement recess to make the P type electrode and the N type electrode electrically connect to the P type electrode plate and the N type electrode plate respectively; and covering the arrangement recess with an optical member to manufacture the LED assembly.

In the preferred embodiment of the present invention, an initial examination can be executed after the manufacturing processes of the molded LED chip cell are finished, and then arrange the molded LED chip cell, which has passed the initial examination, to the arrangement recess. Furthermore, a progressive examination can be executed after the molded LED chip is arranged into the arrangement recess, and the P type electrode and the N type electrode are electrically connected to the P type electrode plate and the N type electrode plate respectively. When the result of the progressive examination is failed, it is able to remove the molded LED chip cell from the arrangement recess, arrange the molded LED chip cell into the arrangement recess, and make the P type electrode and the N type electrode be electrically connected to the P type electrode plate and the N type electrode plate respectively again; or it is able to be replaced by another one of the molded LED chip cell, which has passed the initial examination.

Even more, due to that in the present invention, it is able to make the optical properties of the light beam projected from the LED chip be modulated twice respectively via the light-transmissible gel and the optical member. Therefore, after the LED assembly is manufactured, it is able to execute a final examination to make sure whether the optical properties of the light beam projected from the LED chip comply with the predetermined standard after been modulated twice.

Comparing with the conventional method for manufacturing the LED assembly as disclosed in prior arts, in the present invention, a packaging process is executed firstly to manufacture a molded LED chip cell, and then arrange the molded LED chip cell into the arrangement recess and cover the arrangement recess with a optical member. Thus, it is able to make the optical properties of the light beam projected from the LED chip be modulated twice respectively via the light-transmissible gel and the optical member, so as to make the limitation of the design of optical properties become less.

Nevertheless, after manufacturing the molded LED chip cell, the initial examination can be executed to make sure that all the molded LED chip cells provided for the following manufacturing processes are qualified. More importantly, when the result of the progressive examination is failed, it is able to remove the molded LED chip cell from the arrangement recess, arrange the molded LED chip cell into the arrangement recess, and make the P type electrode and the N type electrode be electrically connected to the P type electrode plate and the N type electrode plate respectively again; or it is able to be replaced by another one of the molded LED chip cell, which has passed the initial examination. Finally, after the manufacturing processes of LED assembly are finished, it is able to execute the final examination. Obviously, through the three-period examinations, i.e., the initial examination, the progressive examination, and the final examination, it is able to improve the quality of the LED assembly and further save the manufacturing cost.

The devices, characteristics, and the preferred embodiment of this invention are described with relative figures as follows.

BRIEF DESCRIPTION OF THE DRAWINGS

The structure and the technical means adopted by the present invention to achieve the above and other objectives can be best understood by referring to the following detailed description of the preferred embodiments and the accompanying drawings, wherein.

DETAILED DESCRIPTION OF THE PREFERRED EMBODIMENTS

The method for manufacturing LED assembly as provided in accordance with the present invention can be widely applied to manufacture many kinds of LED assemblies, and the combined applications of the present invention are too numerous to be enumerated and described, so that only one preferred embodiment is disclosed as follows for representation.

Figure 2A:
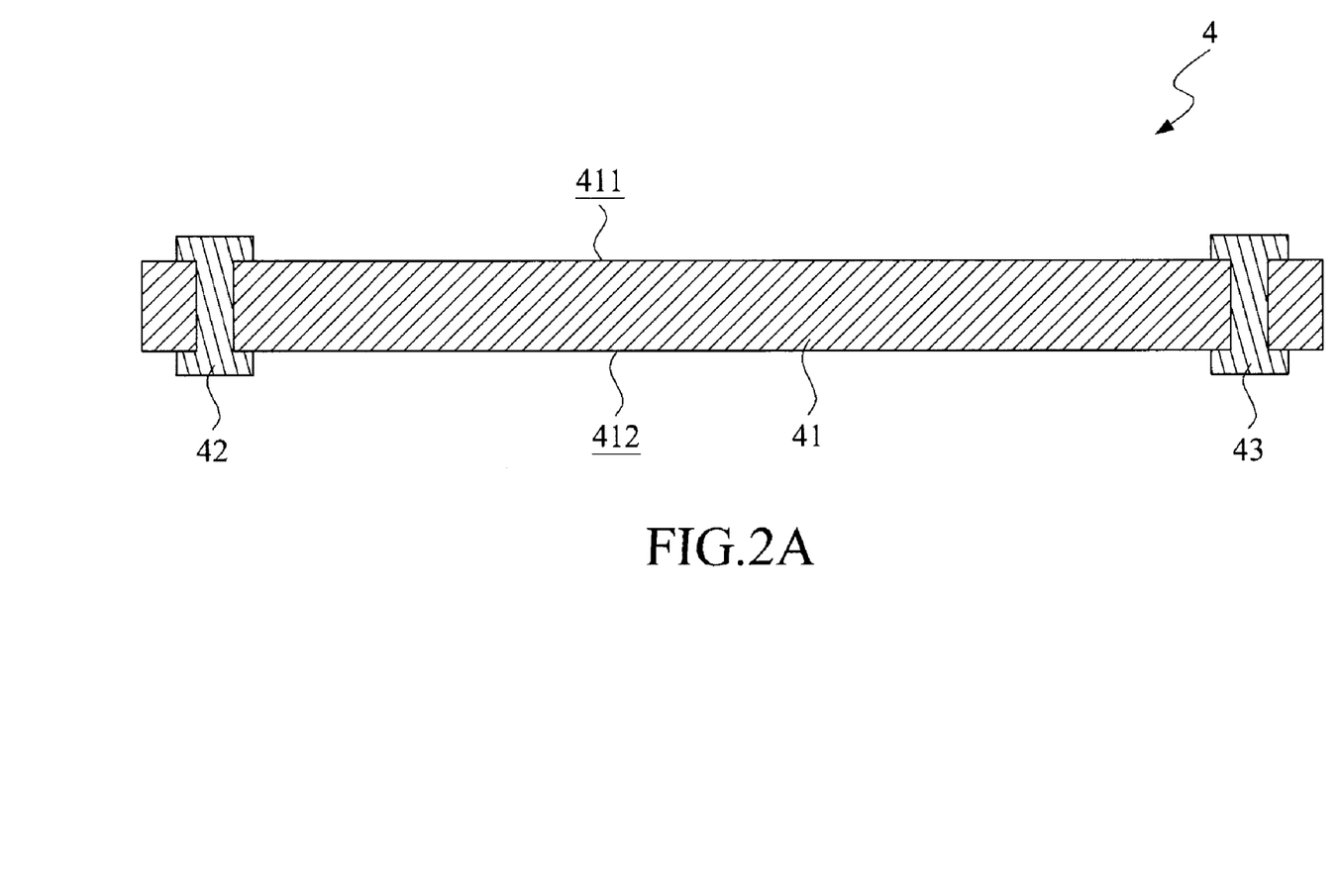
FIG. 2A illustrates the step for manufacturing a chip carrier in a preferred embodiment of the present invention.

Please refer to the drawings from FIG. 2A to FIG. 2E, which illustrate a series of steps for manufacturing the LED assembly in accordance with the preferred embodiment of the present invention. The most important concept, which is disclosed in the preferred embodiment of the present invention, is to manufacture a molded LED chip cell 200 (shown in FIG. 2C) firstly, and then to manufacture a LED assembly 300 (shown in FIG. 2E). As shown in FIG. 2A, which illustrates the step for manufacturing a chip carrier in a preferred embodiment of the present invention, when manufacturing the molded LED chip cell 200, it is necessary to manufacture or prepare a chip carrier 4. The chip carrier comprises a carrier substrate 41, a P type electrode 42 and an N type electrode 43. The carrier substrate 41 has a top surface 411 and a bottom surface 412, and the P type electrode 42 and the N type electrode 43 perforate through the carrier substrate 41 and explode from the bottom surface 412.

Figure 2B:
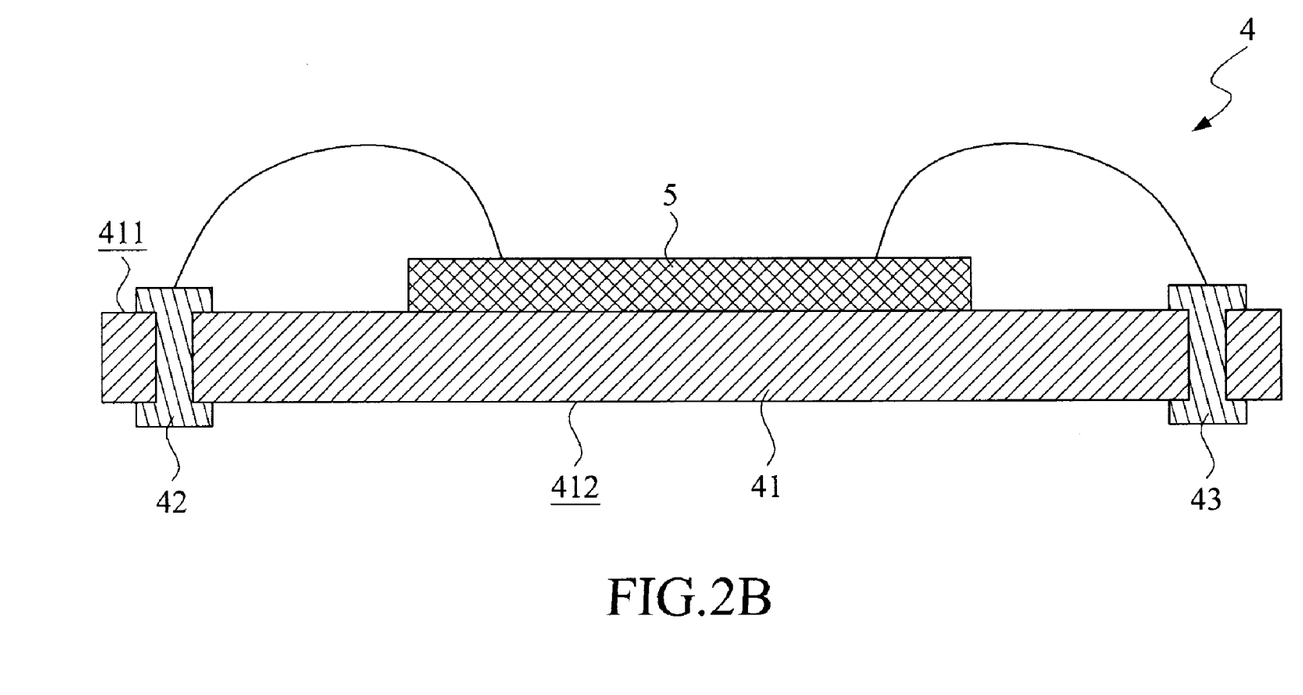
FIG. 2B illustrates the step that a LED chip is arranged into the chip carrier and a bonding process is finished in the preferred embodiment of the present invention.

Next, please refer to FIG. 2B, which illustrates the step that a LED chip is arranged into the chip carrier and a bonding process is finished in the preferred embodiment of the present invention. After manufacturing the chip carrier 4, an LED chip 5 can be arranged onto the top surface 411 of the carrier substrate 41 of the chip carrier 4, a bonding process can be execute to make two lead wires connect the LED chip 5 to the P type electrode 42 and the N type electrode 43 respectively, so as to make the LED chip 5 be electrically connected with the P type electrode 42 and the N type electrode 43 respectively.

Figure 2C:
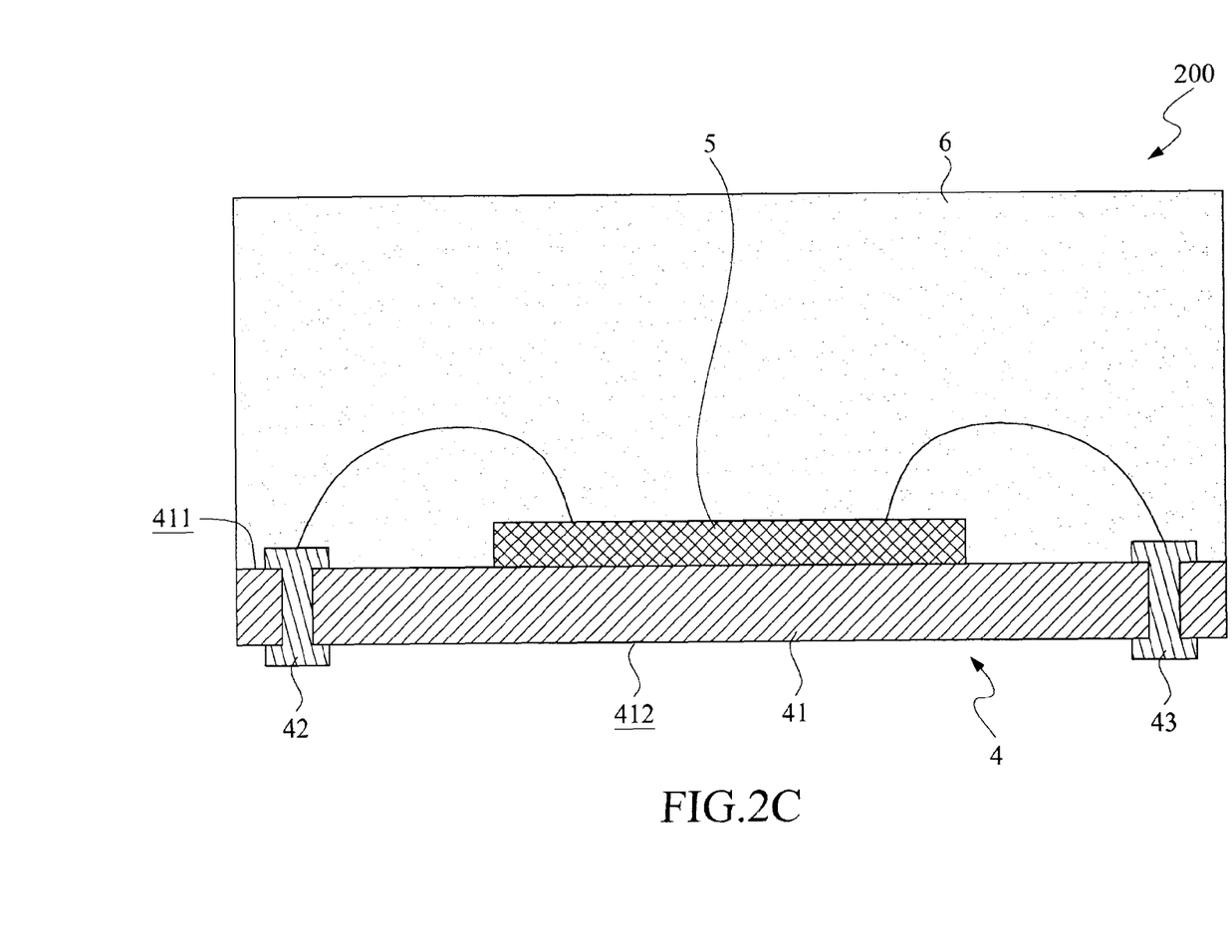
FIG. 2C illustrates the step that a light transmissible gel is applied to package the LED chip in the preferred embodiment of the present invention.

Following up, please refer to FIG. 2C, which illustrates the step that a light transmissible gel is applied to package the LED chip in the preferred embodiment of the present invention. After making the LED chip 5 be electrically connected with the P type electrode 42 and the N type electrode 43 respectively, it is able to use a light-transmissible gel 6 to make the LED chip arranged on the top surface be packaged therein, and keep the P type electrode 42 and the N type electrode 43 being exploded from the bottom surface 412. After the light-transmissible gel 6 is solidified, the molded LED chip cell 200 is manufactured. The light-transmissible gel 6 can be composed of a molding compound. Preferably, the molding compound can be epoxy resin or silicone gel.

After all of the molded LED chip cells 200 are manufactured, an initial examination, which can include electrical examination item(s) and optical examination item(s), for all of the molded LED chip cells 200 can be executed to abandon the molded LED chip cell(s) 200 failed to pass the initial examination, so as to make sure the rest of the molded LED chip cells 200 are qualified.

Figure 2D:
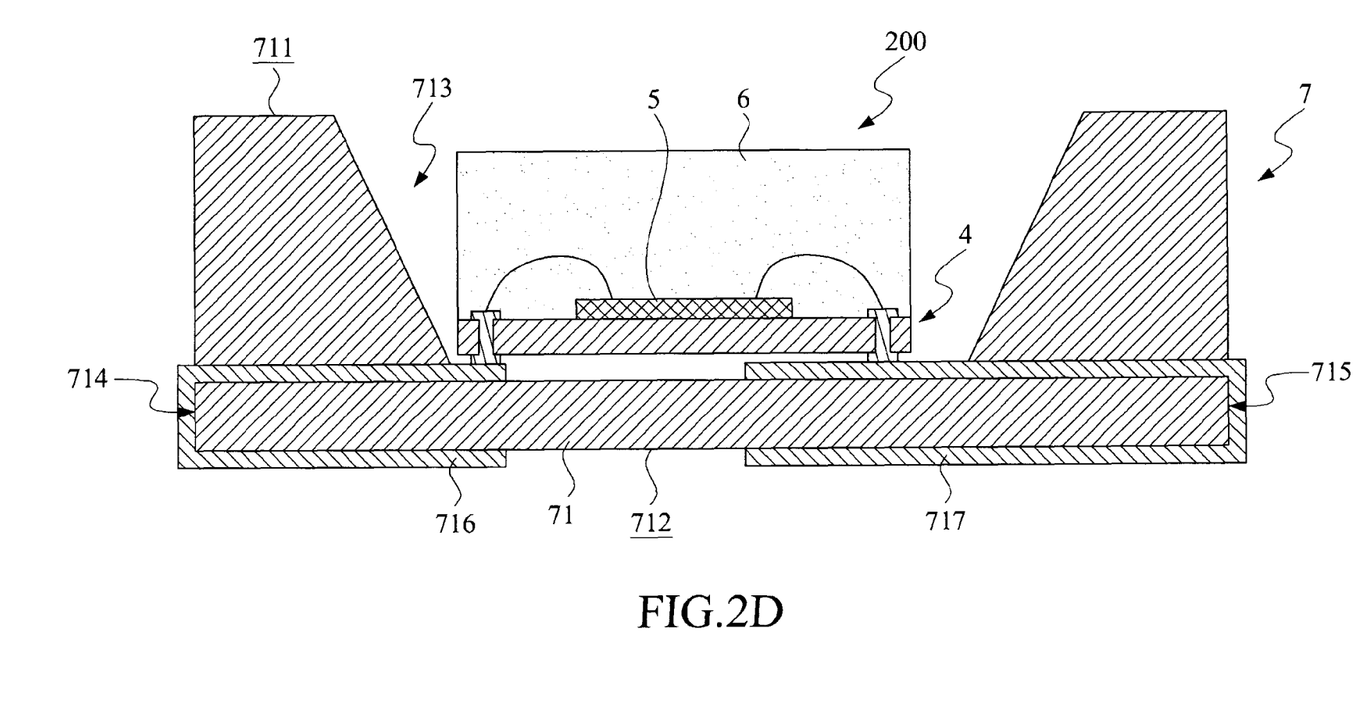
FIG. 2D illustrates the step that an arrangement carrier is prepared, and the molded LED chip cell is arranged into the arrangement recess of the arrangement carrier in the preferred embodiment of the present invention.

Following up, please refer to FIG. 2D, which illustrates the step that an arrangement carrier is prepared, and the molded LED chip cell is arranged into the arrangement recess of the arrangement carrier in the preferred embodiment of the present invention. Except for manufacturing the molded LED chip cell 200, it is necessary to manufacture or prepare an arrangement carrier 7, which comprises an arrangement carrier substrate 71, a P type electrode plate 716 and an N type electrode plate 717.

The arrangement carrier substrate 71 has a light-emitting surface 711 and a back surface 712, and the light-emitting surface 711 is formed with an arrangement recess 713. Moreover, the arrangement carrier substrate 71 further has a first side 714 and a second side 715. The P type electrode plate 716 is extended from the bottom of the arrangement recess 713 to the first side 714, and further extended out to partially wrap the back surface 712. The N type electrode plate 717 is extended from the bottom of the arrangement recess 713 to the second side 714, and also extended out to partially wrap the back surface 712. In the preferred embodiment of the present invention, the arrangement carrier substrate 71 is suggested to be manufactured via a high-temperature injection molding process, and the arrangement recess is suggested to be formed via a punching process.

After manufacturing or preparing the arrangement carrier 7, it is able to arrange the molded LED chip cell 200 into the arrangement recess 713, and use a melted soldering material (not shown in the drawings) to make the P type electrode 42 and the N type electrode 43 (shown in FIG. 2C) be electrically connected to the P type electrode plate 716 and the N type electrode plate 717 respectively.

At the same time, it is able to execute a progressive examination, also can include electrical examination item(s) and optical examination item(s). When the result of the progressive examination is failed, it is able to remove the molded LED chip cell 200 from the arrangement recess 713, arrange the molded LED chip cell 200 into the arrangement recess 713, and make the P type electrode 42 and the N type electrode 43 be electrically connected to the P type electrode plate 716 and the N type electrode plate 717 respectively again; or it is able to be replaced by another one of the molded LED chip cell 200, which has passed the initial examination.

Figure 2E:
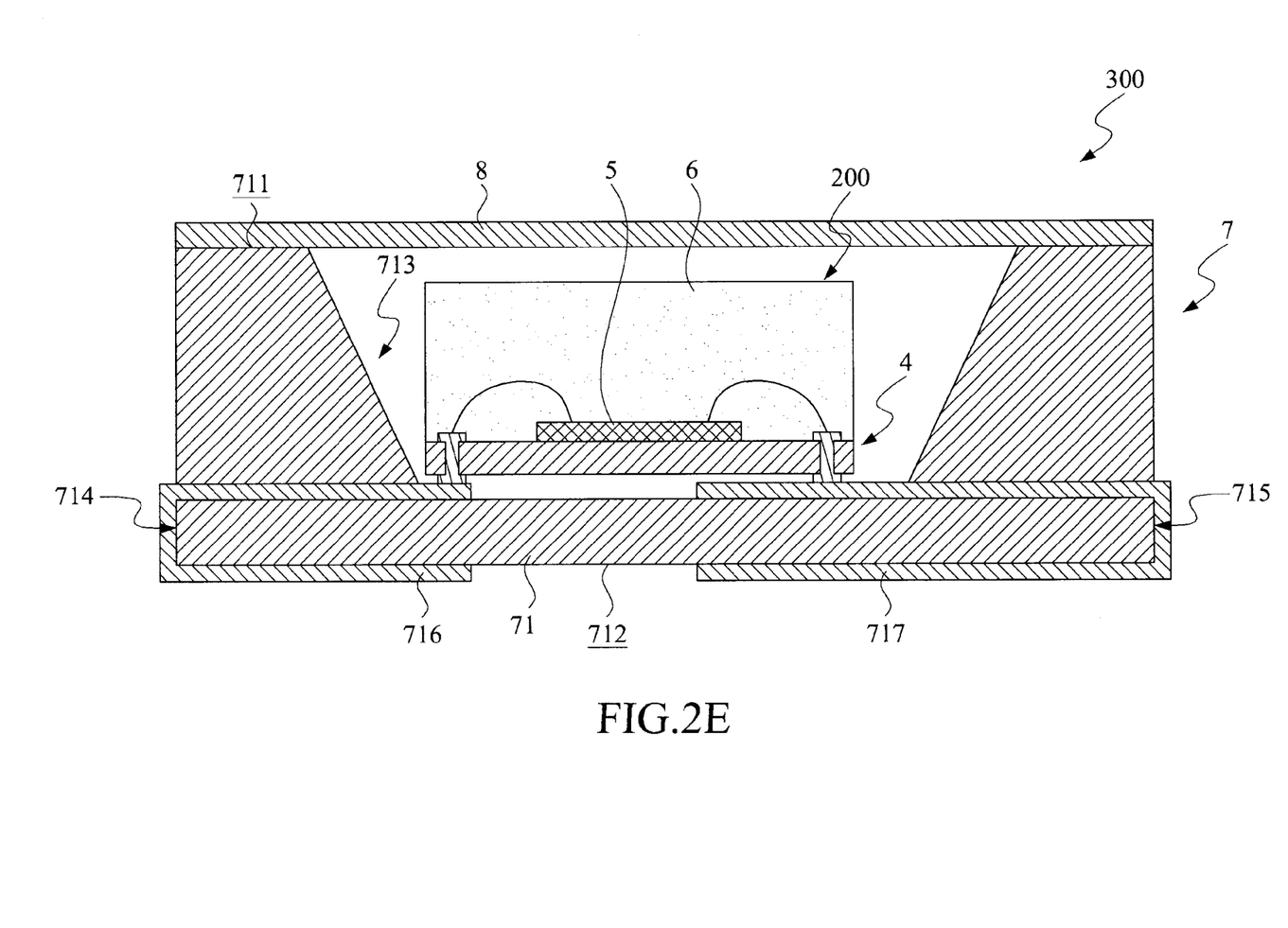
FIG. 2E illustrates the step that an optical member is applied to cover the arrangement recess to manufacture the LED assembly in the preferred embodiment of the present invention.

Finally, please refer to FIG. 2E, which illustrates the step that an optical member is applied to cover the arrangement recess to manufacture the LED assembly in the preferred embodiment of the present invention. After passing the progressive examination, it is able to cover the arrangement recess with an optical member 8 to manufacture the LED assembly 300. In the preferred embodiment of the present invention, the optical member 8 can be a light-concentration lens, a light-diffusion lens, another light-transmissible gel with phosphor powder therein, or any other optical member capable of providing the function of modulating the optical properties.

Obviously, in the preferred embodiment, the optical properties of the light beam projected from the LED chip 5 can be modulated at least twice respectively via the light-transmissible gel 6 and the optical member 8. Thus, after the manufacturing processes of the LED assembly 300 is finished, it is able to execute a final examination being focused on the optical examination item(s).

After reading the technologies as disclosed above, it is believable that people skilled in ordinary art can realize that in the present invention, the optical properties of the light beam projected from the LED chip 5 can be modulated at least twice respectively via the light-transmissible gel 6 and the optical member 8, so that it is able to make the limitation of the design of optical properties become less with respect to the prior art. Additionally, via the three-period examinations, i.e., the initial examination, the progressive examination, and the final examination, it is able to improve the quality of the LED assembly and further save the manufacturing cost.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A method being applied to manufacture a light emitting diode (LED) assembly comprising the steps of:
   (a) preparing a chip carrier comprising a carrier substrate, a P type electrode and an N type electrode;
   (b) arranging an LED chip onto the carrier substrate to electrically connect the LED chip with the P type electrode and the N type electrode, packaging the LED chip with a light-transmissible packaging gel, and making the P type electrode and the N type electrode exposed to form a molded LED chip cell;
   (c) preparing an arrangement carrier comprising a arrangement carrier substrate, a P type electrode plate and an N type electrode plate, wherein the arrangement carrier substrate has a light-emitting surface and a back surface, the light-emitting surface is formed with an arrangement recess, and the P type electrode plate and the N type electrode plate are extended out of the arrangement carrier substrate and partially wrapped the back surface of the arrangement carrier substrate;
   (d) arranging the molded LED chip cell into the arrangement recess to make the P type electrode and the N type electrode electrically connect to the P type electrode plate and the N type electrode plate respectively; and
   (e) covering the arrangement recess with an optical member.

2. The method as claimed in claim 1, wherein the carrier substrate has a top surface and a bottom surface, the LED chip is arranged on the top surface being packaged by the light-transmissible packaging gel, and the P type electrode and the N type electrode perforate through the carrier substrate and explode from the bottom surface.

3. The method as claimed in claim 1, wherein in the step (b), at least two lead wires are electrically connected the LED chip to the P type electrode and the N type electrode respectively.

4. The method as claimed in claim 1, wherein in the step (b), the light-transmissible packaging gel is composed of a molding compound.

5. The method as claimed in claim 4, wherein the molding compound is one of epoxy resin and silicone gel.

6. The method as claimed in claim 1, wherein the arrangement carrier substrate is manufactured via a high-temperature injection molding process.

7. The method as claimed in claim 1, wherein in the step (c), the arrangement recess is formed via a punching process.

8. The method as claimed in claim 1, wherein in the step (d), the P type electrode and the N type electrode electrically are respectively connected to the P type electrode plate and the N type electrode plate via a soldering process.

9. The method as claimed in claim 1, wherein in the step (d), wherein the optical member is a light-concentration lens.

10. The method as claimed in claim 1, wherein the optical member is a light-diffusion lens.

11. The method as claimed in claim 1, wherein the step (b) further comprises a step (b1) of executing an initial examination for the molded LED chip cell, and the molded LED chip cell in the step (d) has passed the initial examination in the step (b1).

12. The method as claimed in claim 1, further comprising a step (d1) between the step (d) and (e), wherein in the step (d1), a progressive examination for the molded LED chip cell and the arrangement carrier is executed, and the molded LED chip cell of step (d) is replaced by another one of the molded LED chip cell to execute the following step (e) when the result of the progressive examination in the step (d1) is failed.

13. The method as claimed in claim 1, further comprising a step (d2) between the step (d) and (e), wherein in the step (d2), a progressive examination for the molded LED chip cell and the arrangement carrier is executed, and the molded LED chip cell removed from the arrangement carrier to repeat the step (d) when the result of the progressive examination in the step (d2) is failed.

* * * * *